(12) United States Patent
Worones

(10) Patent No.: US 10,775,409 B2
(45) Date of Patent: Sep. 15, 2020

(54) CLAMP PROBE FOR NON-CONTACT ELECTRICAL PARAMETER MEASUREMENT

(71) Applicant: Fluke Corporation, Everett, WA (US)

(72) Inventor: Jeffrey Worones, Seattle, WA (US)

(73) Assignee: Fluke Corporation, Everett, WA (US)

( * ) Notice: Subject to any disclaimer, the term of this patent is extended or adjusted under 35 U.S.C. 154(b) by 86 days.

(21) Appl. No.: 15/975,000

(22) Filed: May 9, 2018

(65) Prior Publication Data

US 2019/0346484 A1    Nov. 14, 2019

(51) Int. Cl.
| G01R 1/067 | (2006.01) |
| G01R 1/07 | (2006.01) |
| G01R 19/155 | (2006.01) |
| G01R 19/25 | (2006.01) |

(52) U.S. Cl.
CPC ..... *G01R 1/06722* (2013.01); *G01R 1/06733* (2013.01); *G01R 1/07* (2013.01); *G01R 19/155* (2013.01); *G01R 19/2506* (2013.01)

(58) Field of Classification Search
CPC .. G01R 1/06722; G01R 1/06733; G01R 1/07; G01R 19/2506; G01R 19/155
See application file for complete search history.

(56) References Cited

U.S. PATENT DOCUMENTS

| 5,180,972 A | 1/1993 | Schweitzer, Jr. |
| 5,473,244 A | 12/1995 | Libove et al. |
| 5,583,444 A | 12/1996 | Nakamura et al. |
| 5,973,501 A | 10/1999 | Reichard |

(Continued)

FOREIGN PATENT DOCUMENTS

| CN | 2639905 Y | 9/2004 |
| CN | 104459226 A | 3/2015 |

(Continued)

OTHER PUBLICATIONS

Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.

(Continued)

*Primary Examiner* — Dominic E Hawkins
(74) *Attorney, Agent, or Firm* — Seed Intellectual Property Law Group LLP

(57) ABSTRACT

Systems and methods for measuring electrical parameters (e.g., voltage, current, power) in an insulated or blank uninsulated conductor (e.g., insulated wire) without requiring a galvanic connection between the conductor and a clamp probe. A clamp probe may include a normally closed, spring loaded jaw having a flexible strap therein that includes one or more non-contact sensors. The jaw may also include a Rogowski coil to enable non-contact current measurements. A user may compress handles of the clamp probe to open its jaw. In the open position, the user may position the jaw around the conductor under test and release the handles. The jaw then closes and tightens the flexible strap around the insulated conductor such that the one or more non-contact sensors are positioned adjacent the insulated conductor to obtain an accurate measurement of an electrical parameter of the insulated conductor.

18 Claims, 3 Drawing Sheets

(56) References Cited

U.S. PATENT DOCUMENTS

| | | | |
|---|---|---|---|
| 5,990,674 | A | 11/1999 | Schweitzer, Jr. |
| 6,014,027 | A | 1/2000 | Reichard |
| 6,043,640 | A | 3/2000 | Lauby et al. |
| 6,118,270 | A | 9/2000 | Singer et al. |
| 6,644,636 | B1 | 11/2003 | Ryan |
| 6,664,708 | B2 | 12/2003 | Schlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 10,132,841 | B2 * | 11/2018 | Chien .................. G01R 15/186 |
| 2002/0167303 | A1 | 11/2002 | Nakano |
| 2003/0006754 | A1 * | 1/2003 | Landre ..................... G01R 1/22 324/127 |
| 2007/0086130 | A1 * | 4/2007 | Sorensen ............... G01R 15/16 361/62 |
| 2008/0088299 | A1 | 4/2008 | Wolfe et al. |
| 2009/0058398 | A1 | 3/2009 | Ibuki |
| 2010/0060300 | A1 | 3/2010 | Müller et al. |
| 2010/0090682 | A1 | 4/2010 | Armstrong |
| 2010/0148756 | A1 * | 6/2010 | Shah ........................ G01R 1/22 324/126 |
| 2010/0283539 | A1 | 11/2010 | Yanagisawa |
| 2012/0200291 | A1 | 8/2012 | Carpenter et al. |
| 2012/0259565 | A1 | 10/2012 | Oshima et al. |
| 2012/0290240 | A1 | 11/2012 | Fukui |
| 2013/0076343 | A1 * | 3/2013 | Carpenter .............. G01R 19/00 324/202 |
| 2013/0124136 | A1 | 5/2013 | Neeley et al. |
| 2013/0147464 | A1 * | 6/2013 | Tan .......................... G01R 1/22 324/126 |
| 2014/0035607 | A1 * | 2/2014 | Heydron .................. G01R 1/04 324/754.02 |
| 2014/0039838 | A1 * | 2/2014 | Katz ..................... H04L 67/125 702/188 |
| 2014/0062459 | A1 * | 3/2014 | El-Essawy ........... G01R 15/205 324/117 R |
| 2015/0042320 | A1 | 2/2015 | Cadugan et al. |
| 2016/0047846 | A1 * | 2/2016 | Sharma ................ G01R 15/205 324/251 |
| 2016/0080667 | A1 | 3/2016 | Stuart et al. |
| 2016/0091535 | A1 * | 3/2016 | Bannister ........... G01R 19/0092 324/127 |
| 2016/0109486 | A1 | 4/2016 | Yanagisawa |
| 2016/0119592 | A1 | 4/2016 | Stuart et al. |
| 2016/0223588 | A1 * | 8/2016 | Fox ......................... G01S 17/08 |
| 2017/0003320 | A1 * | 1/2017 | Tsujimoto ................ G01R 1/22 |

FOREIGN PATENT DOCUMENTS

| | | |
|---|---|---|
| EP | 1 249 706 B1 | 9/2007 |
| JP | 9-184866 A | 7/1997 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2016-3997 A | 1/2016 |

OTHER PUBLICATIONS

Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.

Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.

Galliana et al., "Traceable Technique to Calibrate Clamp Meters in AC Current From 100 to 1500 A," *IEEE Transactions on Instrumentation and Measurement* 61(9):2512-2518, 2012.

Hioki, "3258 : Safety HiTESTER," Revised Edition 5, Hioki E. E. Corporation, Nagano Japan, 2 pages.

Huber et al., "Non-Contact Voltage Measurement Systems," U.S. Appl. No. 62/421,124, filed Nov. 11, 2016, 122 pages.

Mitchell Instrument Company Inc., clipping from the Mitchell Catalogue, undated, 1 page.

Neeley et al., "Maintenance Management Systems and Methods," U.S. Appl. No. 61/514,842, filed Aug. 3, 2011, 22 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.

Stuart et al., "Imaging System Employing Fixed, Modular Mobile, and Portable Infrared Cameras With Ability to Receive, Communicate, and Display Data and Images With Proximity Detection," U.S. Appl. No. 62/068,392, filed Oct. 24, 2014, 9 pages.

Stuart et al., "Infrared Cameras Used As a Method to Trigger Operation and/or Recording of Test and Measurement Devices," U.S. Appl. No. 62/076,088, filed Nov. 6, 2014, 14 pages.

Takahashi, "Clamp on Power Logger PW3365 : Safety Voltage Sensor PW9020," *HIOKI Technical Notes* 1(1): 2015, 8 pages.

Tsang et al., "Dual capacitive sensors for non-contact AC voltage measurement," *Sensors and Actuators A* 167:261-266, 2011.

Extended European Search Report for EP application No. 19173651.1 dated Sep. 24, 2019, 15 pages.

\* cited by examiner

CLAMP PROBE FOR NON-CONTACT ELECTRICAL PARAMETER MEASUREMENT

BACKGROUND

Technical Field

The present disclosure generally relates to electrical parameter measurement devices, and more particularly, to clamps for electrical parameter measurement devices.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

Thus, there is a need for an AC voltage measurement system which provides convenient and accurate voltage measurements without requiring galvanic contact with the circuit being tested.

BRIEF SUMMARY

A clamp probe for use with a non-contact electrical parameter measurement device to measure an electrical parameter in an insulated conductor under test may be summarized as including: a clamp portion including first and second clamp arms that include respective proximal and distal ends, the first and second clamp arms movable relative to each other between a closed position wherein the distal ends of the first and second clamp arms are substantially adjacent each other and a clamp cavity sized and dimensioned to receive an insulated conductor is formed between the first and second clamp arms, and an open position wherein the distal ends of the first and second clamp arms are spaced apart from each other to permit the insulated conductor to pass between the first and second distal ends into the clamp cavity; a bias element coupled to the clamp portion that biases the first and second clamp arms toward the closed position; a grip portion operative to be actuated by a user to cause the clamp portion to move from the closed position into the open position against the bias applied by the bias element; a flexible strap including a first strap end and a second strap end, the first strap end coupled to the distal end of the first clamp arm and the second strap end coupled to the distal end of the second clamp arm, at least a portion of the flexible strap being elastically deformable around the insulated conductor positioned within the clamp cavity to exert a force against the insulated conductor in a direction toward the distal ends of the first and second clamp arms; and at least one non-contact sensor coupled to the flexible strap between the first strap end and the second strap end of the flexible strap, the at least one non-contact sensor positioned proximate the insulated conductor when the insulated conductor is within the clamp cavity.

The at least one non-contact sensor may include a plurality of non-contact sensors spaced apart from each other on the flexible strap. The bias element may include a spring. At least a portion of the flexible strap may be made from a natural or synthetic elastomer. The first and second clamp arms may include a Rogowski coil that enables non-contact measurement of current in the insulated conductor. The clamp probe may further include an interface connector operatively coupled to the at least one non-contact sensor, the interface connector being detachably coupleable to a corresponding interface connector of a main body of the non-contact electrical parameter measurement device.

A device for measuring an electrical parameter in an insulated conductor may be summarized as including: a clamp probe, including: a clamp portion including first and second clamp arms that including respective proximal and distal ends, the first and second clamp arms movable relative to each other between a closed position wherein the distal ends of the first and second clamp portions are substantially adjacent each other and a clamp cavity sized and dimensioned to receive an insulated conductor is formed between the first and second clamp arms, and an open position wherein the distal ends of the first and second clamp portions are spaced apart from each other to permit the insulated conductor to pass between the first and second distal ends into the clamp cavity; a bias element coupled to the clamp portion that biases the first and second clamp arms toward the closed position; a grip portion operative to be actuated by a user to cause the clamp portion to move from the closed position into the open position against the bias applied by the bias element; a flexible strap including a first strap end and a second strap end, the first strap end coupled to the distal end of the first clamp arm and the second strap end coupled to the distal end of the second clamp arm, at least a portion of the flexible strap being elastically deformable around the insulated conductor positioned within the clamp cavity to exert a force against the insulated conductor in a direction toward the distal ends of the first and second clamp arms; and at least one non-contact sensor coupled to the flexible strap between the first strap end and the second strap end of the flexible strap, the at least one non-contact sensor positioned proximate the insulated conductor when the insulated conductor is within the clamp cavity; control circuitry communicatively coupleable to the at least one non-contact sensor, in operation, the control circuitry: receives sensor data indicative of signals detected by the at least one non-contact sensor; and processes the received sensor data to determine at least one electrical parameter of the insulated conductor.

The device may further include a main body that contains the control circuitry. The main body may include at least one interface connector, and the clamp probe may be detachably connectable to the at least one interface connector of the main body. The device may further include a main body that includes the clamp probe and the control circuitry. The at least one non-contact sensor may include a plurality of non-contact sensors spaced apart from each other on the flexible strap. The control circuitry, in operation, may process the received sensor data to determine a voltage in the insulated conductor. The control circuitry, in operation, may process the received sensor data to determine a current in the insulated conductor. The device may further include: a wireless communications subsystem operatively coupled to the control circuitry, in operation, the wireless communication subsystem wirelessly may transmit the determined electrical parameter to an external system. The device may further include: a display that, in operation, visually presents the determined electrical parameter to a user of the device. The first and second clamp arms of the clamp probe may include a Rogowski coil that enables non-contact measurement of current in the insulated conductor. The bias element of the clamp probe may include a spring. At least a portion of the flexible strap of the clamp probe may be made from a natural or synthetic elastomer.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
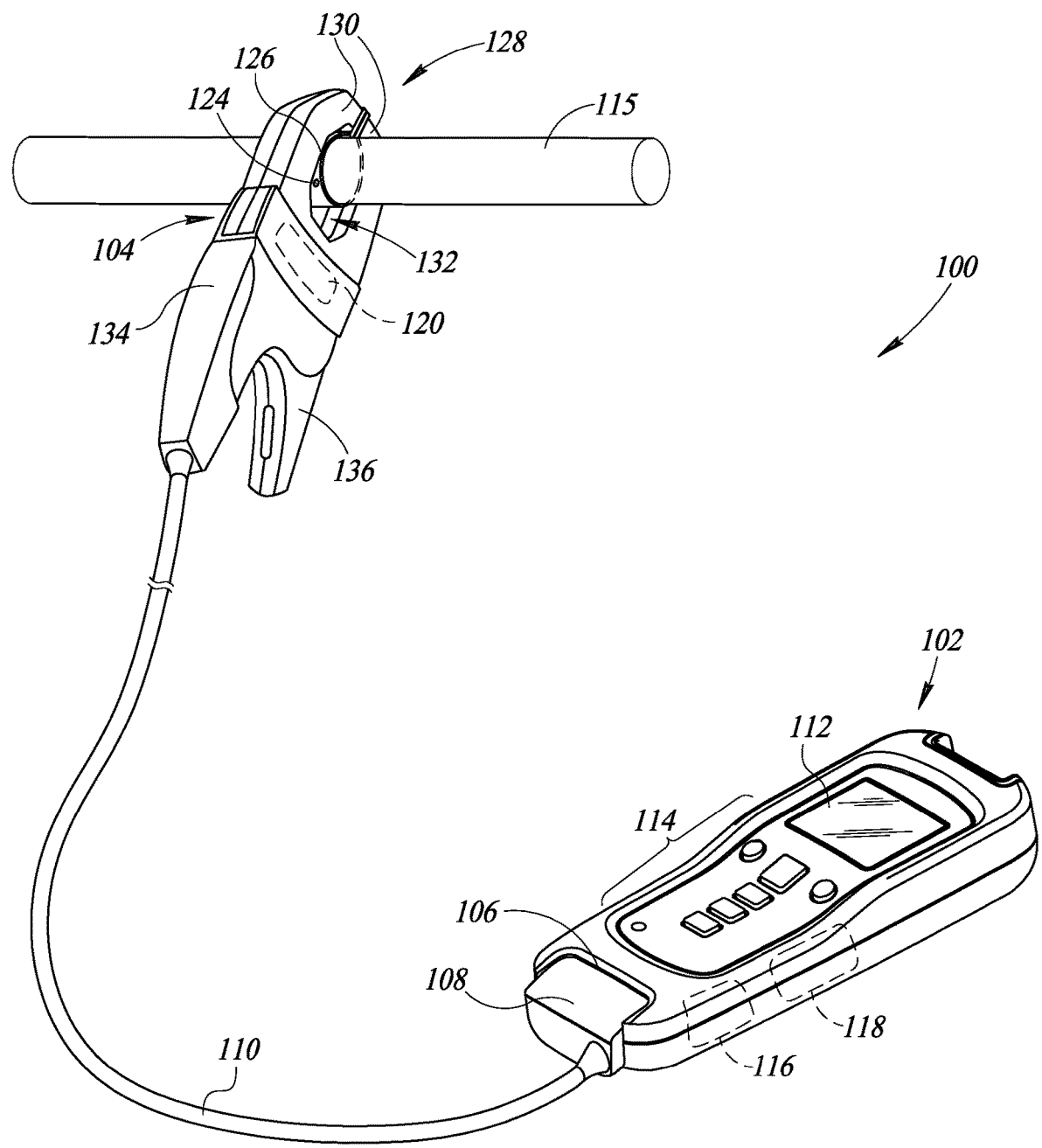
FIG. 1 is a pictorial diagram of an electrical parameter measurement device, according to one non-limiting illustrated implementation.

One or more implementations of the present disclosure are directed to systems and methods for measuring electrical parameters (e.g., voltage, current, power) in an insulated or blank uninsulated conductor (e.g., insulated wire) without requiring a galvanic connection between the conductor and a clamp probe. Generally, a non-galvanic contact (or "non-contact") electrical parameter measurement system or device is provided which measures one or more electrical parameters in an insulated conductor. Such systems which do not require a galvanic connection are referred to herein as "non-contact." As used herein, "electrically coupled" includes both direct and indirect electrical coupling unless stated otherwise.

In at least some implementations, a non-contact measurement clamp probe is provided that includes a normally closed, spring loaded jaw having a flexible strap therein that includes one or more non-contact sensors. The flexible strap may be formed from any suitable material, such as a stretchable fabric, a natural elastomer, synthetic elastomer, etc. The jaw may also include a Rogowski coil to enable non-contact current measurements. The jaw may be shaped to optimize placement of the clamp probe into a standard electrical cabinet to measure electrical parameters of insulated conductors therein. Various size jaws may be provided for various wire sizes. As discussed further below, in operation, a user may squeeze or otherwise actuate handles of the clamp probe to open its jaw. In the open position, the user may position the jaw around the insulated conductor under test and release the handles. The jaw then closes and tightens the flexible strap around the insulated conductor such that the one or more non-contact sensors are positioned adjacent the insulated conductor to obtain an accurate measurement of an electrical parameter of the insulated conductor.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

FIG. 1 shows a pictorial diagram of an electrical parameter measurement device 100 in the form of a clamp meter. The electrical parameter measurement device 100 includes a main body or housing 102 and a clamp probe 104. The clamp probe 104 comprises a clamp body 134 coupled to an interface connector 108 via a cable 110. The main body 102 includes an interface connector 106 that detachably couples with the corresponding interface connector 108 of the clamp probe 104.

The main body 102 further includes a display 112 that presents measurement results and other information, and an input user interface 114 for inputting information such as measurement instructions or other information. The display 112 may be a display of any suitable type, such as a liquid crystal display (LCD), a light-emitting diode (LED) display, an organic LED display, a plasma display, or an e-ink display. The main body 102 may include one or more audio or haptic outputs (not shown), such as one or more speakers, buzzers, vibration devices, etc. In the illustrated implementation, the input user interface 114 comprises a plurality of buttons, but in other implementations the user interface may additionally or alternatively include one or more other types of input devices, such as a touch pad, touch screen, wheel, knob, dial, microphone, etc.

The main body 102 may also include a power supply, such as a battery or battery pack, for supplying power to the various components of the main body and the clamp probe 104. The main body 102 also includes control circuitry 116 that controls the various operations of the electrical parameter measurement device 100, such as receiving signals from the clamp probe 104, determining one or more electrical parameters of an insulated conductor 115 under measurement, and outputting measurement data (e.g., to the display 112). The control circuitry 116 may include one or more processors (e.g., microcontroller, DSP, ASIC, FPGA), one or more types of memory (e.g., ROM, RAM, flash memory, other nontransitory storage media), and/or one or more other types of processing or control related components.

In at least some implementations, the main body 102 may include a wireless communications subsystem 118, which may include one or more of a Bluetooth® module, a Wi-Fi® module, a ZIGBEE® module, a near field communication (NFC) module, etc. The main body 102 may be operative to communicate wirelessly via the wireless communications subsystem 118 with an external receiving system, such as a computer, smart phone, tablet, personal digital assistant, etc., so as to transmit measurement results to the external system or to receive instruction signals or input information from an external system. The main body 102 may additionally or alternatively include a wired communications subsystem, such as a USB interface, etc.

Although only one clamp probe 104 is shown for explanatory purposes, in at least some implementations, a plurality of different clamp probes may be detachably coupleable to the main body 102 of the electrical parameter measurement device 100. The plurality of clamp probes may differ in at least one of shape, structure, or function, for example, to provide various functionality for the electrical parameter measurement device 100.

As discussed further below, the clamp probe 104 includes one or more non-contact sensors 124 coupled thereto that are operative to sense one or more electrical parameters in the insulated conductor 115 under test. The clamp probe 104 may include processing or control circuitry 120 operatively coupled to the one or more sensors 124 that is operative to process sensor signals received from the one or more sensors, and is operative to send sensor data indicative of such sensor signals to the control circuitry 116 of the main body 102 for processing. The control circuitry 120 may additionally or alternatively include conditioning or conversion circuitry that is operative to condition or convert the sensor signals into a form receivable by the main body 102, such as an analog form (e.g., 0-1 V) or a digital form (e.g., 8 bits, 16 bits, 64 bits).

The clamp probe 104 includes a clamp portion 128 having two clamp arms 130 which can be opened and closed relative to each other. As discussed further below with reference to FIGS. 2 and 3, the clamp portion 128 may include one or more non-contact sensors that can measure an electrical parameter (e.g., current, voltage) in the conductor 115 without requiring galvanic contact between the one or more sensors and the conductor. The non-contact sensors may include a non-contact voltage sensor, a Hall Effect element, a current transformer, a fluxgate sensor, an anisotropic magnetoresistance (AMR) sensor, a giant magnetoresistance (GMR) sensor, or other types of sensors operative to sense an electrical parameter of the conductor 115 without requiring galvanic contact. Various non-limiting examples of non-contact sensors are disclosed in U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, the contents of which are incorporated herein by reference, in their entirety.

The clamp arms 130 may be biased together by a bias element (e.g., spring) to form a normally closed, spring loaded jaw. A flexible strap 126 that carries one or more sensors 124 (only one shown in FIG. 1) is coupled to the distal ends of each of the clamp arms 130. In operation a user may compress a handle 136 of the clamp probe 104 to open the jaw formed by the clamp arms 130. In the open position, the user may position the clamp arms 130 around the conductor 115 under test and release the handle 136. The jaw then closes and tightens the flexible strap 126 around the insulated conductor 115 such that the one or more non-contact sensors 124 are positioned adjacent the insulated conductor 115 to obtain an accurate measurement of an electrical parameter of the insulated conductor.

In at least some implementations, in operation, the control circuitry 120 of the clamp probe 104 transmits measurement data from the sensor(s) 124 to the main body 102 of the electrical parameter measurement device 100, and the control circuitry 116 determines one or more electrical parameters in the conductor 115 based on the received measurement data. For example, the control circuitry 116 may utilize one or more mathematical formulas, lookup tables, calibration factors, etc., to determine the one or more electrical parameters. Further, some electrical parameters, such as power or phase angles, may be derived from other determined electrical parameters, such as current and voltage.

As noted above, the interface connector 108 may be detachably coupled with the corresponding interface connector 106 on the main body 102 of the electrical parameter measurement device 100, for example, such that different clamp probes may be coupled to the main body 102. In at least some implementations, the interface connector 108 of the clamp probe 104 may be configured as one of a plug and a socket, and the interface connector 106 of the main body 102 may be configured as the other of a plug and socket. In other implementations, the interface connectors 106 and 108 may be configured as different types of connectors that are operative to be detachably coupled to each other.

Further, in some implementations, the clamp probe 104 may be fixedly connected to the main body 102 by the cable 110. In other implementations, the clamp probe 104 and the main body 102 may be formed together in a single housing, such that the cable 110 is not required.

Figure 2:
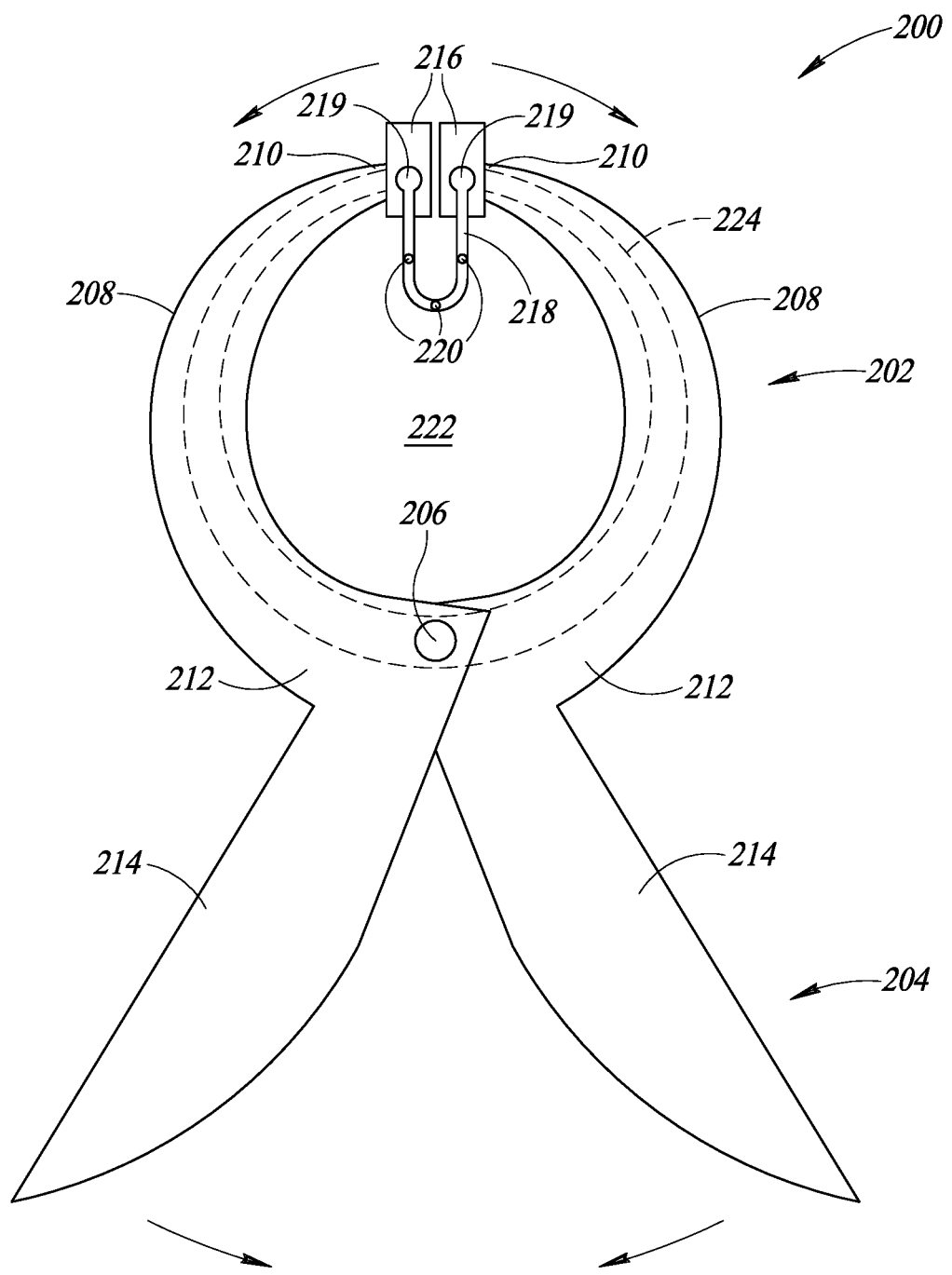
FIG. 2 is a pictorial diagram of a clamp probe of an electrical parameter measurement device detachably coupleable to a main body of the electrical parameter measurement device, according to one non-limiting illustrated implementation.
Figure 3:
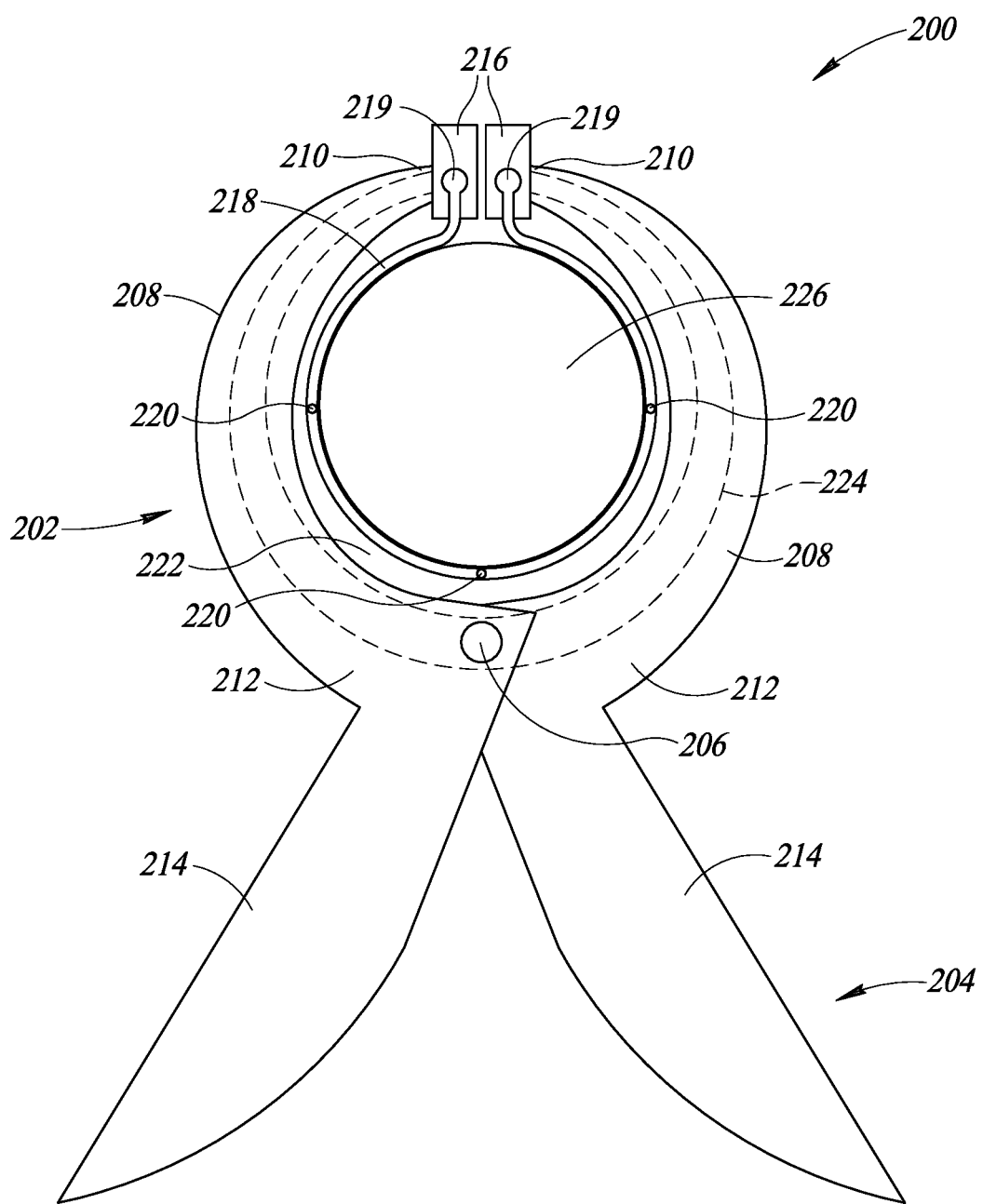
FIG. 3 is a pictorial diagram of the clamp probe of FIG. 2, shown with an insulated conductor clamped by a flexible strap of the clamp probe, according to one non-limiting illustrated implementation.

FIGS. 2 and 3 show a clamp probe 200 of an electrical parameter measurement device. The clamp probe 200 may include similar or identical components and functionality as the clamp probe 104 and/or main body 102 of the electrical parameter measurement device 100 of FIG. 1. Accordingly, the description of all of the various features and functionality discussed above is not repeated below for the sake of brevity.

The clamp probe 200 includes a clamp portion 202 that includes first and second clamp arms 208. The first and second clamp arms 208 include respective distal ends 210 and proximal ends 212. The clamp probe 200 includes a grip portion 204 opposite the clamp portion 202 that includes handles 214. A bias element and pivot pin 206 (e.g., spring) may be provided, which urges the first and second clamp arms 208 toward each other. In particular, the first and second clamp arms 208 are movable relative to each other. Due to the bias element 206, the first and second clamp arms 208 are normally in a closed position, shown in FIGS. 2 and 3, wherein the distal ends 210 of the first and second clamp arms are substantially adjacent each other and a clamp cavity 222 sized and dimensioned to receive an insulated conductor 226 (FIG. 3) is formed between the first and second clamp arms. To insert the conductor 226 into the clamp cavity 222 as shown in FIG. 3, the user may squeeze the handles 214 to move the clamp arms 208 into an open position wherein the distal ends 210 of the clamp arms are spaced apart from each other to permit the insulated conductor to pass between the first and second distal ends 210 into the clamp cavity 222.

The clamp probe 200 includes a flexible strap 218 that includes first and second strap ends 219 attached to attachment points 216 positioned at the distal ends 210 of the clamp arms 208. The strap ends 219 are fixedly coupled to respective distal ends 210 of the clamp arms. As shown in FIG. 3, at least a portion of the flexible strap 218 is elastically deformable around the insulated conductor 226 when the insulated conductor is positioned within the clamp cavity 222 to exert a force against the insulated conductor in a direction toward the distal ends 210, upward in FIG. 3, of the first and second clamp arms 208. As non-limiting examples, at least a portion of the flexible strap 218 may be made from a natural or synthetic elastomer.

The flexible strap 218 includes one or more non-contact sensors 220 coupled thereto between the strap ends 219. As shown, when the insulated conductor 226 is in the clamp cavity 222 and maintained in position by the flexible strap 218, the non-contact sensors 220 are positioned proximate (e.g., adjacent) to the insulated conductor 226 which allows the sensors to obtain accurate measurements of one or more electrical parameters of the conductor 226. That is, the flexible strap 218 controls the position of the conductor 226 relative to the non-contact sensors 220 to provide a known, minimal distance between the sensors and the conductor. In the illustrated example, the clamp probe includes 200 includes three non-contact sensors 220 coupled to the flexible strap 218. It should be appreciated that in other implementations, fewer or more non-contact sensors may be coupled to the flexible strap 218, e.g., one sensor, two sensors, 20 sensors, etc.

In the illustrated implementation, the clamp probe 200 also includes a Rogowski coil 224 that allows for non-contact current measurements in the insulated conductor 226 in addition to the non-contact voltage measurements obtained by the sensors 220. As an example, the clamp arms 208 may be provided with a core portion made of magnetic materials (e.g., ferromagnetic material, high magnetic alloy) and a coil surrounding the core portion. As noted above, the clamp arms 208 can be opened to place the conductor 226 in the clamp cavity 222 wherein the conductor is secured in place by the flexible strap 218. When the clamp arms 208 are closed, the distal ends 210 of the two clamp arms 208 may abut each other to form a closed loop surrounding the conductor 226. When the clamp portion 202 is closed to form a closed loop surrounding the conductor 226, the conductor functions like the primary coil of a transformer, and the coil surrounding the core portion in the clamp arms 208 functions like the secondary coil of the transformer. The current flowing through the conductor 226 induces magnetic flux in the core portion of the clamp portion 202, thereby generating an induced voltage in the coil of the clamp portion. The induced voltage signal may be transmitted processing circuitry (e.g., processing circuitry 120 or 116 of FIG. 1), which is operative to determine the current in the conductor 226 based on the induced voltage signal.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that they are not inconsistent with the specific teachings and definitions herein, U.S. Provisional Patent Application No. 62/421,124, filed Nov. 11, 2016; U.S. patent application Ser. No. 15/345,256, filed Nov. 7, 2016; U.S. patent application Ser. No. 15/413,025, filed Jan. 23, 2017; U.S. patent application Ser. No. 15/412,891, filed Jan. 23, 2017; U.S. patent application Ser. No. 15/604,320, filed May 24, 2017, and U.S. patent application Ser. No. 15/625,745, filed Jun. 16, 2017, are incorporated herein by reference, in their entirety. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A clamp probe for use with a non-contact electrical parameter measurement device to measure an electrical parameter in an insulated conductor under test, the clamp probe comprising:
   a clamp portion comprising first and second clamp arms that comprise respective proximal and distal ends, the first and second clamp arms movable relative to each other between a closed position wherein the distal ends of the first and second clamp arms are substantially adjacent each other and a clamp cavity sized and dimensioned to receive an insulated conductor is formed between the first and second clamp arms, and an open position wherein the distal ends of the first and second clamp arms are spaced apart from each other to permit the insulated conductor to pass between the first and second distal ends into the clamp cavity;
   a bias element coupled to the clamp portion that biases the first and second clamp arms toward the closed position;
   a grip portion operative to be actuated by a user to cause the clamp portion to move from the closed position into the open position against the bias applied by the bias element;
   a flexible strap comprising a first strap end and a second strap end, the first strap end coupled to the distal end of the first clamp arm and the second strap end coupled to the distal end of the second clamp arm, at least a portion of the flexible strap being elastically deformable around the insulated conductor positioned within the clamp cavity to exert a force against the insulated conductor in a direction toward the distal ends of the first and second clamp arms,
   wherein, while the first and second clamp arms are in the closed position, a portion of the flexible strap that faces at least one of the first and second clamp arms is at least partially spaced apart from the at least one of the first and second clamp arms; and
   at least one non-contact sensor coupled to the flexible strap between the first strap end and the second strap end of the flexible strap, the at least one non-contact sensor positioned proximate the insulated conductor when the insulated conductor is within the clamp cavity.

2. The clamp probe of claim 1, wherein the at least one non-contact sensor comprises a plurality of non-contact sensors spaced apart from each other on the flexible strap.

3. The clamp probe of claim 1, wherein the bias element comprises a spring.

4. The clamp probe of claim 1, wherein at least a portion of the flexible strap is made from a natural or synthetic elastomer.

5. The clamp probe of claim 1 wherein the first and second clamp arms include a Rogowski coil that enables non-contact measurement of current in the insulated conductor.

6. The clamp probe of claim 1, further comprising an interface connector operatively coupled to the at least one non-contact sensor, the interface connector being detachably coupleable to a corresponding interface connector of a main body of the non-contact electrical parameter measurement device.

7. A device for measuring an electrical parameter in an insulated conductor, the device comprising:
   a clamp probe, comprising:
      a clamp portion comprising first and second clamp arms that comprise respective proximal and distal ends, the first and second clamp arms movable relative to each other between a closed position wherein the distal ends of the first and second clamp portions are substantially adjacent each other and a clamp cavity sized and dimensioned to receive an insulated conductor is formed between the first and second clamp arms, and an open position wherein the distal ends of the first and second clamp portions are spaced apart from each other to permit the insulated conductor to pass between the first and second distal ends into the clamp cavity;
      a bias element coupled to the clamp portion that biases the first and second clamp arms toward the closed position;
      a grip portion operative to be actuated by a user to cause the clamp portion to move from the closed position into the open position against the bias applied by the bias element;
      a flexible strap comprising a first strap end and a second strap end, the first strap end coupled to the distal end of the first clamp arm and the second strap end coupled to the distal end of the second clamp arm, at least a portion of the flexible strap being elastically deformable around the insulated conductor positioned within the clamp cavity to exert a force against the insulated conductor in a direction toward the distal ends of the first and second clamp arms,
      wherein, while the first and second clamp arms are in the closed position, a portion of the flexible strap that faces at least one of the first and second clamp arms is at least partially spaced apart from the at least one of the first and second clamp arms; and
      at least one non-contact sensor coupled to the flexible strap between the first strap end and the second strap end of the flexible strap, the at least one non-contact sensor positioned proximate the insulated conductor when the insulated conductor is within the clamp cavity;
   control circuitry communicatively coupleable to the at least one non-contact sensor, in operation, the control circuitry:
      receives sensor data indicative of signals detected by the at least one non-contact sensor; and
      processes the received sensor data to determine at least one electrical parameter of the insulated conductor.

8. The device of claim 7, further comprising a main body that contains the control circuitry.

9. The device of claim 8, wherein the main body comprises at least one interface connector, and the clamp probe is detachably connectable to the at least one interface connector of the main body.

10. The device of claim 7, further comprising a main body that includes the clamp probe and the control circuitry.

11. The device of claim 7, wherein the at least one non-contact sensor comprises a plurality of non-contact sensors spaced apart from each other on the flexible strap.

12. The device of claim 7, wherein the control circuitry, in operation, processes the received sensor data to determine a voltage in the insulated conductor.

13. The device of claim 7, wherein the control circuitry, in operation, processes the received sensor data to determine a current in the insulated conductor.

14. The device of claim 7, further comprising:
a wireless communications subsystem operatively coupled to the control circuitry, in operation, the wireless communication subsystem wirelessly transmits the determined electrical parameter to an external system.

15. The device of claim 7, further comprising:
a display that, in operation, visually presents the determined electrical parameter to a user of the device.

16. The device of claim 7 wherein the first and second clamp arms of the clamp probe include a Rogowski coil that enables non-contact measurement of current in the insulated conductor.

17. The device of claim 7, wherein the bias element of the clamp probe comprises a spring.

18. The device of claim 7, wherein at least a portion of the flexible strap of the clamp probe is made from a natural or synthetic elastomer.

* * * * *